US005512360A

United States Patent [19]
King

[11] Patent Number: 5,512,360
[45] Date of Patent: Apr. 30, 1996

[54] PTFE REINFORCED COMPLIANT ADHESIVE AND METHOD OF FABRICATING SAME

[75] Inventor: David R. King, Baltimore, Md.

[73] Assignee: W. L. Gore & Associates, Inc., Newark, Del.

[21] Appl. No.: 309,275

[22] Filed: Sep. 20, 1994

[51] Int. Cl.$^6$ .................................................. B32B 9/00
[52] U.S. Cl. ................................ 428/304.4; 428/308.4; 428/309.9; 428/311.1; 428/316.6; 428/317.1; 428/289; 428/290; 428/209
[58] Field of Search ........................... 428/304.4, 308.4, 428/309.9, 316.6, 317.1

[56] References Cited

U.S. PATENT DOCUMENTS

| | | |
|---|---|---|
| 3,556,161 | 1/1971 | Roberts . |
| 3,692,710 | 9/1972 | Lorcher . |
| 3,953,566 | 4/1976 | Gore ........................ 264/288 |
| 4,335,180 | 6/1982 | Traut . |
| 4,640,866 | 2/1987 | Suzuki . |
| 4,680,220 | 7/1987 | Johnson . |
| 4,692,369 | 9/1987 | Nomi ........................ 428/198 |
| 4,734,321 | 3/1988 | Radvan et al. ............. 428/283 |
| 4,784,901 | 11/1988 | Hatakeyama et al. . |
| 4,822,694 | 4/1989 | Randin et al. ............. 428/615 |
| 4,983,434 | 1/1991 | Sassa ........................ 428/36.2 |
| 5,034,801 | 7/1991 | Fischer . |
| 5,075,155 | 12/1991 | Jellinek et al. ............ 428/304.4 |
| 5,098,776 | 3/1992 | Kobayashi et al. ....... 428/402 |

FOREIGN PATENT DOCUMENTS

| | | |
|---|---|---|
| 0535471 | 7/1983 | European Pat. Off. . |
| 0248617 | 12/1987 | European Pat. Off. . |
| 0307123 | 3/1989 | European Pat. Off. . |
| 2195269 | 7/1988 | United Kingdom . |

OTHER PUBLICATIONS

Article: "Microporous Polypropylene Sheets Containing Polymethylsilsesquioxane Filler" Authors: Satoshi Nago and Yukio Mitzutani; Journal of Applied Polymer Science, vol. 50, 1815–1822 (1993).

Primary Examiner—Patrick J. Ryan
Assistant Examiner—Kam F. Lee
Attorney, Agent, or Firm—Victor M. Genco, Jr.

[57] ABSTRACT

The present invention relates to a fluoropolymeric substrate that is formed from at least one layer of porous, expanded polytetrafluoroethylene having a void volume of at least 50% and containing 15 to at most 40% by weight adhesive that is evenly distributed within the substrate to allow exterior surfaces of said substrate to be free of adhesive after bonding while forming a discontinuous internal layer of adhesive interrupted by the skeletal structure of the substrate.

8 Claims, 3 Drawing Sheets

PTFE REINFORCED COMPLIANT ADHESIVE AND METHOD OF FABRICATING SAME

FIELD OF THE INVENTION

The present invention relates to compliant polymeric composites that have adhesive properties and are used for fabricating printed circuit boards and electronic devices. In particular, the present invention relates to the preparation and use of an expanded porous polytetrafluoroethylene substrate having a fibril-node infra-structure that provides a high degree of porosity, i.e., void volume, for receiving from about 15 to at most 40% by weight adhesive resin, based on the total weight of the composite.

BACKGROUND OF THE INVENTION

The electronics industry uses low dielectric constant and flexible materials in a variety of applications, including the fabrication of many devices, such as printed circuit boards and flexible circuits. Polypropylene and fluoropolymers, such as polytetrafluoroethylene (PTFE) exemplify some of the polymers that are used because of their low dielectric constant and low modulus. These material properties can be enhanced when the polymers are highly porous. The problems with these materials have been that material properties are often compromised when the porous material is attached to another material in the fabrication of the printed circuit board, flexible circuit, or other device.

In order to attach the porous polymer to another material, the polymer is either fused or bonded with an adhesive. The fusing process often involves high temperatures and pressures (PTFE requires 700F and 1000 psi) and is not practical in most applications. Use of an adhesive provides for ease of processing, but the properties of the adhesive are not as desirable as those of the polymer. Therefore the adhesive degrades the performance of the porous polymer. Attempts at minimizing the effect of the adhesive have centered around coating adhesive only on the surface to be bonded. Though this does work, the adhesive bond strength is often limited.

In addition, higher resin contents have also been used to provide good flow and adhesion around circuit traces on the surface being bonded. Though resin does flow to fill in the gaps, the porous polymer does not flow around the circuit traces. Lowering the amount of resin allows the porous polymer to flow around the traces, but with the existing technique of surface coating the resin, adhesion is compromised.

Other attempts to provide flexible printed circuit board materials include using porous polytetrafluoroethylene as a base sheet containing cured bismaleimide-triazine resin. Composites containing 40% and 60% adhesive by weight are formed from the bismaleimide-triazine adhesive and offer low dielectric and flexible properties to the composite material. In preparing this resin-containing polytetrafluoroethylene composite, bismaleimide-triazine resin is caused to permeate the porous node fibril texture of the expanded polytetrafluoroethylene material and is cured. As a result, the resin effectively enters the microstructure of the minute fibers and engages and binds itself with the minute fibers that give rise to an integral sheet-like material. The bismaleimide-triazine resin binds to the fibers and nodes in the interior as well as on the outer surfaces of the expanded polytetrafluoroethylene matrix material. However, there is no recognition that adhesive quantity is critical or that surface located adhesive is detrimental.

Other flexible polymeric composites for use in the electronics industry involve impregnating other resins into sintered expanded polytetrafluoroethylene. The resins include epoxy, polyamide, polyester, acrylic, triazine and bismaleimide/triazine resins. As a result of the sintering, the porous polytetrafluoroethylene has less flexibility. Here too there is no recognition that adhesive quantity and location are significant.

Although adhesive containing polymeric substrates have been prepared, almost no attention was placed on the particular mechanism used to add the adhesive to the polymeric matdx. In general, the adhesive was applied in an indiscriminate manner whereby the adhesive would not only be located within a portion of the composite matrix but would also flow over and cover exteriorly located fibril and node portions. For example, the adhesive was applied as a layered coating on one surface of the polymeric composite. As a result, the outer surface of the composite was essentially and substantially completely covered by an adhesive.

Crack-failure that occurs with time and use is propagated within a continuous layer of adhesive at the bond line that results from surface coating and/or high quantities of adhesives. These and other problems have been overcome by the present invention that provides a "discontinuous" layer of adhesive that in an uncompressed state remains within the void volume of the uncompressed polymeric matrix and where the coating of exterior surfaces of the polymeric infra-structure is substantially, if not totally, eliminated.

SUMMARY OF THE INVENTION

The present invention provides an adhesive layer that overcomes crack propagation that can result from exterior adhesive coatings or excessive, adhesive loadings, e.g., loadings of pure adhesive. It was unexpected that a discontinuous layer of adhesive, in an amount between 15 and at most 40% by weight would allow the fibril-node structure of expanded fluoropolymers, such as, polytetrafluoroethylene to reduce, if not eliminate crack propagation while at the same time provide substantially the same high degree of adhesion only thought possible through the use of high adhesive loadings.

Thus, the present invention relates to a prepreg adhesive composite, preferably in sheet form that reduces crack-propagation. The prepreg material is formed from a porous polymeric substrate that provides good adhesion, low modulus, low dielectric constant and loss. Moreover, the prepreg sheet of the present invention is easy to handle and process. In particular, the prepreg sheet comprises at least one layer of an expanded fluoropolymer, preferably a polytetrafluoroethylene material having an initial void volume of at least 50–95% (preferably 75–85%) and containing between 15 and at most 40% by weight (based upon the total weight of the polymeric prepreg in an uncompressed state) of adhesive to form an uncured prepreg that eliminates or substantially reduces adhesive on the exterior, outer surfaces of the expanded polymeric structure.

It is an aspect of the present invention to provide a prepreg using less adhesive while at the same time maintaining substantially the same degree of adhesive properties offered by high quantity adhesive containing prepregs.

It is another aspect of the present invention to prepare a compliant noncrack propagating bond ply by providing a porous layer of an expanded fluoropolymer having an initial void volume of at least 50%, solvent impregnating an adhesive into the interior void volume of the expanded fluoropolymer layer to at least partially occupy the initial void volume to form a discontinuous, internally positioned impregnated layer of uncured adhesive within the fluoropolymer substrate.

It is an object of the present invention to provide a composite having at least one layer of expanded polytetrafluoroethylene containing low quantities of adhesives, high adhesion capability for use in printed circuit boards, microwave substrates, and flexible circuits.

It is a still further object of the present invention to provide an adhesive sheet having low adhesive quantities that can be laminated together into a multi-layer substrate for use in electronics equipment.

It is a further object of the present invention to provide an expanded polytetrafluoroethylene matrix containing 15 to at most 40% by weight of adhesive to form an adhesive compliant layer with minimal adhesive on the exterior surface of the fibril node structure of the polytetrafluoroethylene matrix in application.

These and other objects will become apparent when interpreted in light of the following description and attached drawings.

DETAILED DESCRIPTION OF THE INVENTION

Figure 1:
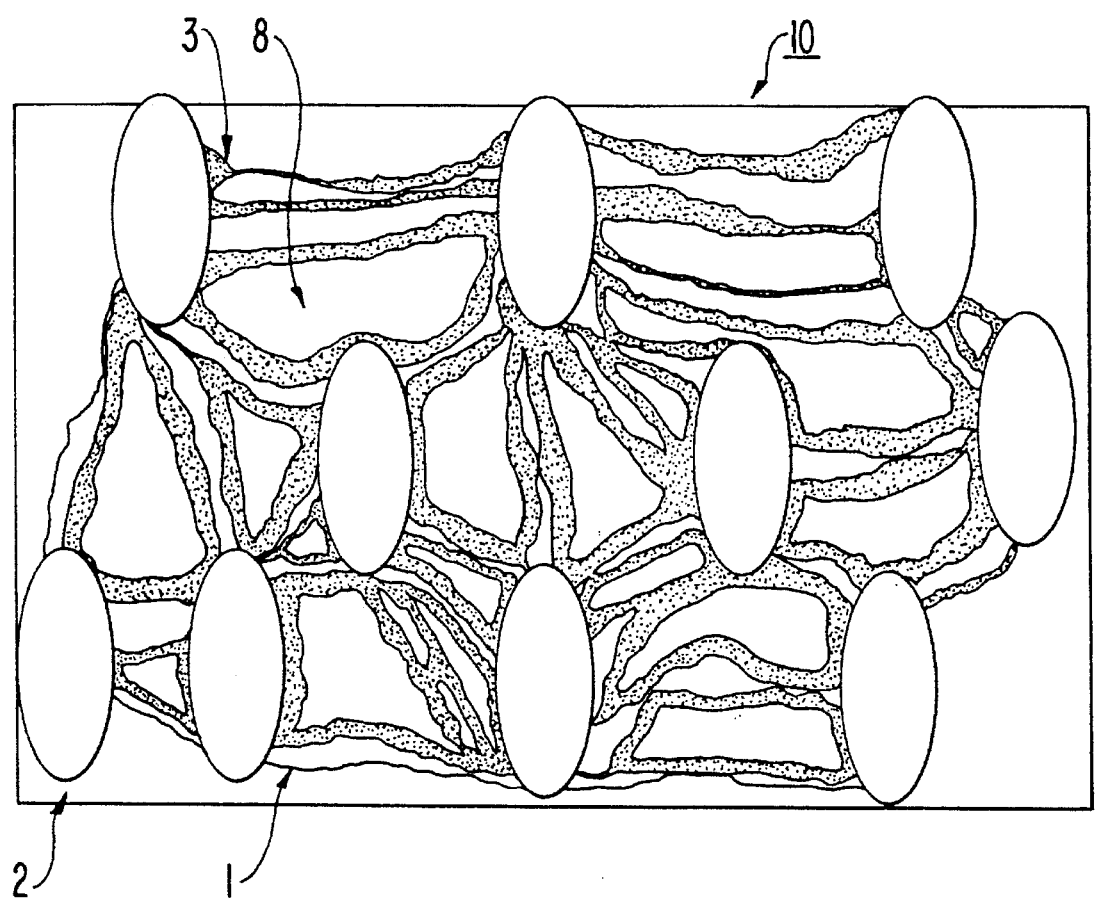
FIG. 1 shows a cross section of a compliant expanded polytetrafluoroethylene matrix and adhesive composite of the present invention.

The present invention relates to a prepreg substrate that is used for printed circuit boards and microwave substrates for use in the electronics industry. The prepreg comprises at least one layer of an expanded fluoropolymer, such as, porous expanded polytetrafluoroethylene. The expanded polytetrafluoroethylene is prepared in accordance with the teachings of U.S. Pat. No. 3,953,566 incorporated herein by reference, and may contain up to 10% by weight of a copolymer of perfluoroalkyl ether and tetrafluoroethylene (PFA), e.g., perfluoropropylvinyl ether-tetrafluoroethylene or a copolymer of tetrafluoroethylene and hexafluoropropylene (FEP). The polytetrafluoroethylene used in the present invention and containing the adhesive is considered "unfilled" because it does not contain fillers such as ceramics particles or fibers, metallic particles or fibers, etc. The polytetrafluoroethylene is expanded in accordance with the techniques of U.S. Pat. No. 3,953,566 to have a void volume of at least 50%, preferably 70–95%, and most preferably 75–85%. As seen in FIG. 1, the uncompressed prepreg 10 is formed from expanded polytetrafluoroethylene having a matrix with fibrils 1 that interconnect nodes 2 and define therebetween a high void volume 8. The high void volume 8, fibrils 1 and interconnected nodes 2 form the scaffolding for the compliant prepreg layer 10.

The quantity of resin adhesive 3 impregnated into the void volume 8 of the polytetrafluoroethylene fibril node matrix is between 15 and at most 40% by weight of the total matrix weight. It has unexpectedly been found that by reducing the adhesive to 15 to at most 40% by weight, better adhesion by the resin itself and prevention of fracture and cracking can be obtained. This is because a change in the failure mechanism of laminated sheets has occurred. In the conventional design, a polytetrafluoroethylene sheet would be impregnated with a high to moderate quantity of resin and result in a layer of polytetrafluoroethylene that has impregnated adhesive as well as surface located adhesive. As a result, when multiple sheets of this prior art prepreg are laminated to one another or to another surface and failure occurs, a crack is propagated along the entire bond line between the contacting surface portions of the juxtaposed layers.

Figure 2:
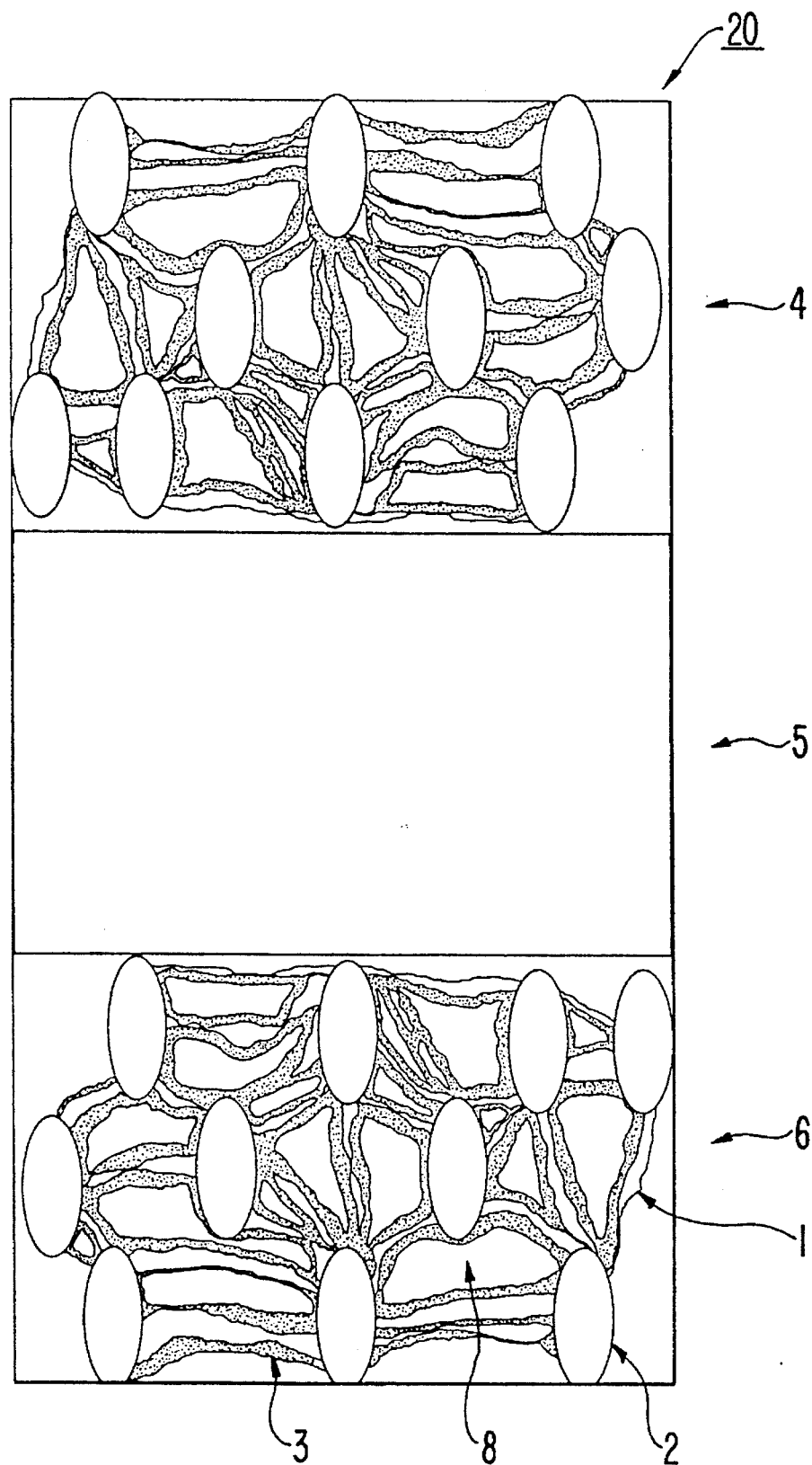
FIG. 2 provides a cross section of two layers of the prepreg of the present invention laminated on either side of a polymer film, all in an uncompressed condition.

On the other hand, when using the low resin content polytetrafluoroethylene matrix composite of the present invention, see FIG. 2, composite 20 contains two layers 4 and 6, each containing fibrils 1 interconnecting nodes 2 and containing resin 3, that are laminated to layer 5. According to the present invention, adhesive 3 is essentially only located within the void volume 8 of the polymer composite. As a result, nodes and fibrils on the outer most surface effectively interrupt the adhesive and provide what would be viewed as a discontinuous layer of adhesive. Thus, when a crack occurs, it propagates until it reaches a fibril or node portion at which point a crack will be discontinued. The absence of the adhesive on the surface of the fibril or node terminates the propagation of the crack and thus provides for a more integral laminate.

Figure 3:
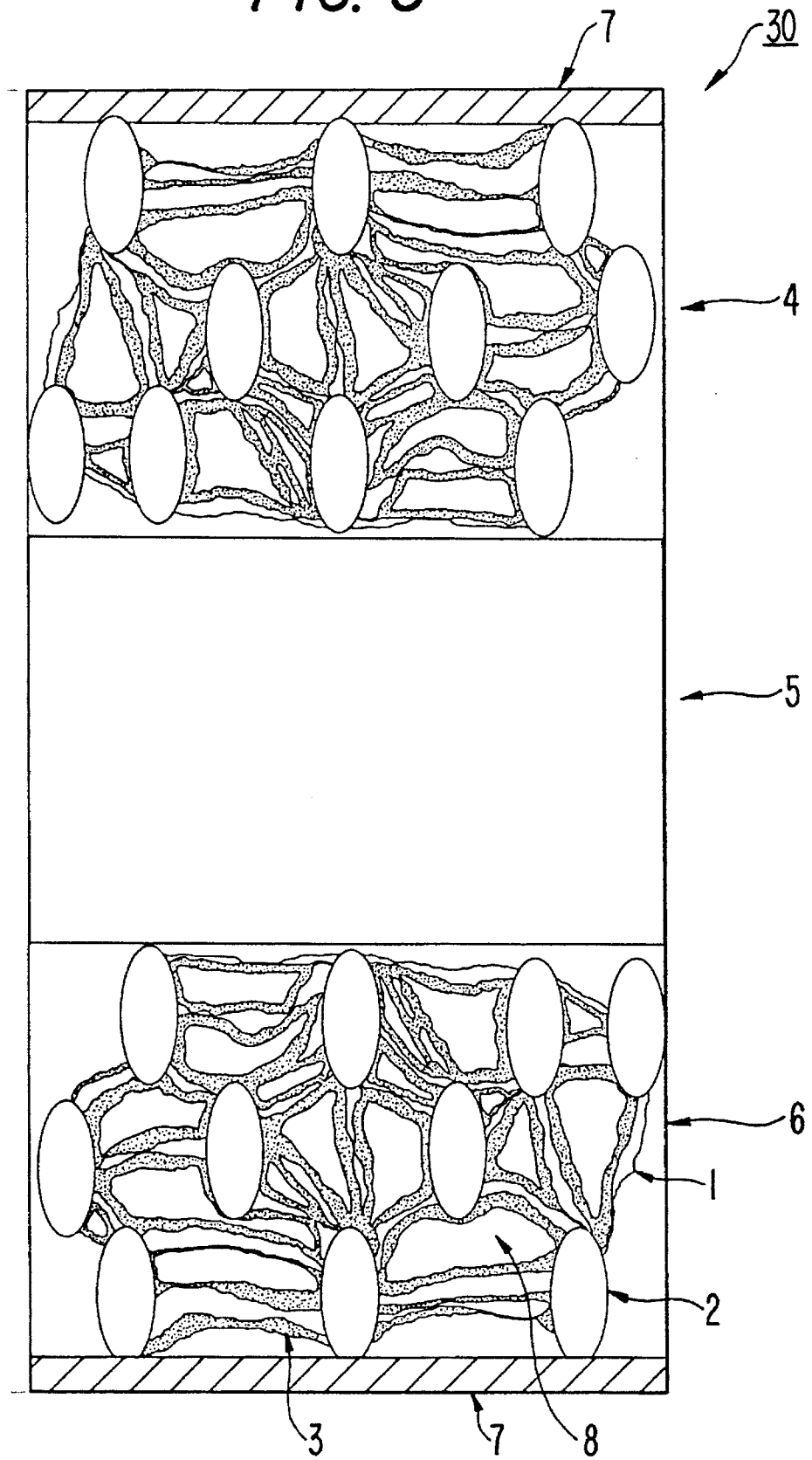
FIG. 3 Is a cross section of a plurality of prepregs according to the present invention laminated between metal foil sheets.

In FIG. 3, composite 30 contains two layers 4 and 6, each containing fibrils 1, nodes 2, resin 3 and void volume 8 and layers 4 of a polymeric film and layers 7 of a metal foil, such as copper. The composite 30 will be compressed to force the air from void volume 8 while at the same time allowing the uncured resin 3 to occupy a greater percentage of the remaining void volume. As a result of the compression, uncured resin contacts either the void volume in an adjacent layer or an inner surface of layers 7. Due to the low resin content of the prepreg, the exterior surfaces of the polytetrafluoroethylene will directly contact an inner surface of layer 7 without uncured resin being located therebetween.

Although the present invention prefers to use epoxy and cyanate ester resins, resins such as polyimide resins, polyester resins, acrylic resins, triazine resins, bismaleimide/triazine resins, polyolefin resins, a polysulfone resin, a polyether-sulfone resin, and other resins may be used.

The invention will now be described with reference to the following non-limiting examples and comparisons.

COMPARISON-EXAMPLE 1

A first prepreg material for a printed circuit was made by solvent impregnating an expanded polytetrafluoroethylene membrane with a Nelco N-4205-2 epoxy resin. Solvent impregnation was accomplished by submerging the PTFE membrane in a solution of 20% solids and 80% MEK solvent followed by a dip in a solution of 54% solids and 46% MEK solvent. The deposited resin made up 68% of the composite weight of the prepreg. This material was tested and had the following properties:

| | |
|---|---|
| Modulus | = 380 KSI |
| Dk* | = 2.9 |
| Peel Strength | = 7.8 pli |

EXAMPLE 2

An expanded polytetrafluoroethylene membrane having a void volume of 80% was impregnated with the same Nelco N-4205-2 epoxy resin of Comparison 1. The resin quantity amounted to 37% by weight of the total prepreg composite and was prepared in the same manner as that of Comparison example 1. Example 2 was tested and had the following properties:

| | |
|---|---|
| Modulus | = 122 KSI |
| Dk | = 2.4 |
| Peel Strength | = 6.4 pli |

The above two examples demonstrate that a decrease in approximately 45% resin content resulted in a 300% increase in flexibility, commensurate with a nominal drop in Dk and Peel Strength, respectively 17% and 18%. Thus, it was unexpected that it would be possible to lower the percentage of resin and provide a more compliant prepreg of polytetrafluoroethylene for electrical and mechanical uses without significantly lowering the adhesion capability of the prepreg.

COMPARISON-EXAMPLE 3

A low resin prepreg was made by applying to the surface of an expanded polytetrafluoroethylene membrane hot melt cyanate ester resin. The deposited resin made up 37% of the composite by weight. Comparison-Example 3 was tested and had a Peel strength of 1.7 pli after a lamination of 450 psi at 220° C. for 90 minutes.

EXAMPLE 4

In contrast to Comparison-Example 3, expanded polytetrafluoroethylene was impregnated by a solvent impregnating process to incorporate cyanate ester resin, 37% by weight, into the porous PTFE. As a result, the resin was evenly distributed throughout the membrane instead of being located solely on the surfaces. The material had a peel strength of 2.8 pli after a lamination of 450 psi at 220° C. for 90 minutes.

As a result of the solvent impregnating process, Example 4 had a peel strength of 2.8 pli after a lamination of 450 psi at 220° C. for 90 minutes in contrast to the 1.7 pli of Comparison-Example 3. This gave over a 60% increase in adhesion where the only difference was the position of the adhesive with respect to the polytetrafluoroethylene substrate. By distributing the adhesive resin within the polytetrafluoroethylene the failure mode of the adhesive changes and gives the composite better adhesion.

While the invention has been disclosed herein in connection with certain embodiments and detailed descriptions, it will be clear to one skilled in the art that modifications or variations of such details can be made without deviating from the gist of this invention, and such modifications or variations are considered to be within the scope of the claims herein below.

I claim:

1. A compliant, adhesive containing composite comprising:
    at least one layer of an expanded porous polymeric substrate having an initial void volume of at least 50%, with 15 to at most 40% by weight adhesive based upon the total weight of said composite in an initial uncompressed condition, wherein said adhesive is evenly distributed within an interior of said porous polymeric substrate to allow exterior surfaces of said polymeric substrate to be substantially free of adhesive when bonded and thus form a discontinuous internal layer of adhesive interrupted by a skeletal structure of said porous polymeric substrate.

2. The composite according to claim 1, wherein said porous polymeric substrate is expanded polypropylene or an expanded fluoropolymer.

3. The composite according to claim 2, wherein said substrate is a fluoropolymer that is an expanded polytetrafluoroethylene.

4. A composite according to claim 3, wherein said expanded polytetrafluoroethylene contains perfluoroalkyl ethertetrafluoroethylene (PFA) copolymer or a copolymer of tetrafluoroethylene and hexafluoropropylene (FEP).

5. The composite according to claim 3, wherein the void volume is 75 to 95%.

6. The composite according to claim 3, wherein said void volume is about 80%.

7. The composite according to claim 3, wherein said adhesive is present in the amount of 20–30% by weight for said layer.

8. The composite according to claim 3, wherein said adhesive is an epoxy or cyanate ester resin.

* * * * *